United States Patent
Dudek

(10) Patent No.: US 7,816,758 B2
(45) Date of Patent: Oct. 19, 2010

(54) INTEGRATED CIRCUIT HAVING LATERALLY DIELECTRICALLY ISOLATED ACTIVE REGIONS ABOVE AN ELECTRICALLY CONTACTED BURIED MATERIAL, AND METHOD FOR PRODUCING THE SAME

(75) Inventor: Volker Dudek, Brackenheim (DE)

(73) Assignee: Atmel Automotive GmbH, Heilbronn (DE)

( * ) Notice: Subject to any disclaimer, the term of this patent is extended or adjusted under 35 U.S.C. 154(b) by 1105 days.

(21) Appl. No.: 11/491,172

(22) Filed: Jul. 24, 2006

(65) Prior Publication Data
US 2006/0255387 A1  Nov. 16, 2006

Related U.S. Application Data

(63) Continuation of application No. PCT/EP2005/000571, filed on Jan. 21, 2005.

(30) Foreign Application Priority Data
Jan. 23, 2004  (DE) .................. 10 2004 004 512

(51) Int. Cl.
*H01L 27/14* (2006.01)

(52) U.S. Cl. .................. 257/506; 257/395; 257/396; 257/397; 257/508; 257/520; 257/E29.112; 438/294

(58) Field of Classification Search .................. 257/506, 257/508, 520, 741, E27.01, 395–397, E29.112; 438/427, 294
See application file for complete search history.

(56) References Cited

U.S. PATENT DOCUMENTS

| | | | |
|---|---|---|---|
| 5,241,211 A | 8/1993 | Tashiro | |
| 5,494,846 A | 2/1996 | Yamazaki | |
| 6,184,101 B1 | 2/2001 | Tsuzuki | |
| 6,316,336 B1 * | 11/2001 | Blanchard | .................. 438/478 |
| 6,365,447 B1 | 4/2002 | Hebert et al. | |
| 6,383,892 B1 | 5/2002 | Colt, Jr. | |
| 2002/0008299 A1 | 1/2002 | Leonardi | |
| 2003/0017710 A1 | 1/2003 | Yang et al. | |

* cited by examiner

*Primary Examiner*—Matthew E Warren
*Assistant Examiner*—John Lin
(74) *Attorney, Agent, or Firm*—Muncy, Geissler, Olds & Lowe, PLLC

(57) ABSTRACT

An integrated circuit is disclosed that includes a first layer made of active semiconductor material and extending along a first side of a buried layer, and trench structures, which cut through the layer made of active semiconductor material and have dielectric wall regions, whereby the dielectric wall regions isolate electrically subregions of the layer, made of active semiconductor material in the lateral direction, and whereby the trench structures, furthermore, have first inner regions, which are filled with electrically conductive material and contact the buried layer in an electrically conductive manner. The integrated circuit is notable in that the first wall regions of the trench structures completely cut through the buried layer and the second wall regions of the trench structures extend into the buried layer, without cutting it completely. Furthermore, a method for manufacturing such an integrated circuit is disclosed.

3 Claims, 3 Drawing Sheets ing on Jan. 21, 2005, and which claims priority to German Patent
INTEGRATED CIRCUIT HAVING LATERALLY DIELECTRICALLY ISOLATED ACTIVE REGIONS ABOVE AN ELECTRICALLY CONTACTED BURIED MATERIAL, AND METHOD FOR PRODUCING THE SAME This nonprovisional application is a continuation of International Application PCT/EP2005/000571, which was filed on Jan. 21, 2005, and which claims priority to German Patent Application No. DE 102004004512, which was filed in Germany on Jan. 23, 2004, and which are both herein incorporated by reference.

BACKGROUND OF THE INVENTION

1. Field of the Invention

The present invention relates to an integrated circuit having a first layer, made of active semiconductor material and extending along a first side of a buried layer, and trench structures, which cut through the layer made of active semiconductor material and have dielectric wall regions, whereby the dielectric wall regions electrically isolate subregions of the layer, made of active semiconductor material, from one another in the lateral direction, and whereby the trench structures, furthermore, have first inner regions, which are filled with electrically conductive material and contact the buried layer in an electrically conductive manner. The invention relates furthermore to a method for manufacturing such an integrated circuit.

2. Description of the Background Art

An integrated circuit of is known from U.S. Publication No. 2002/0008299 A1. This publication shows trench structures with dielectric wall regions and electrically conductive fillings. Active regions of a semiconductor layer disposed above a buried layer are electrically isolated from one another in a lateral direction by dielectric wall regions. Buried regions are contacted electrically from a surface of the integrated circuit with the electrically conductive fillings. For this purpose, a downwardly open, conductively filled trench ends in each case in a buried region.

It is not possible in this way, however, to achieve a lateral dielectric separation of subregions of a buried layer, which lie under different, for example, under neighboring active regions. In addition, only one level of a trench structure can be electrically contacted by the structures disclosed in U.S. Pat. Application No. 2002/0008299 A1. This type of separation is desirable, however, to control the different active regions with individual electrical properties of the underlying buried regions.

U.S. Pat. No. 6,316,336 discloses a trench structure through which a buried layer is formed and contacted. Disadvantageous hereto is that for forming an extended buried layer, a plurality of tightly bordering trench structures are required and a high temperature is needed for the lateral distribution of a dopant.

From US Publication No. 2003/00017710 a trench structure for forming a shallow trench isolation (STI) is known, through which a repeated application of a silicide etching and a spacer etching an incline in the trench profile is formed. A problem of such structures is that a width of the trench structure is larger than a depth of the trench structure, and that such structures are used for isolation between individual components.

SUMMARY OF THE INVENTION

It is therefore an object of the present invention to provide an integrated circuit with active regions laterally dielectrically isolated from one another, which are disposed above buried regions, and a manufacturing method for such an integrated circuit.

This object is achieved in an integrated circuit of the aforementioned type in that first wall regions of the trench structures completely cut through the buried layer and second wall regions of the trench structures extend into the buried layer without completely cutting it.

Furthermore, this object is achieved by a method of the aforementioned type, which comprises the following steps: creation of a first structured mask on a side, facing away from the buried layer, of the first layer, whereby the first mask has first openings, creation of a second structured mask on the first mask, whereby the second mask has second openings disposed laterally displaced compared with the first openings and partially covering the first openings, so that the first mask together with the second mask defines a first opening cross section and the first mask alone defines a second opening cross section, which is greater than the first opening cross section, etching of a first trench substructure through the first opening cross section, removal of the second mask, etching of a second trench substructure through the second opening cross section into the buried layer, deposition of a dielectric onto the inner surfaces of the formed trench structure, and filling of the rest of the trench structure with electrically conductive material.

By virtue of the fact that the first wall regions of the trench structures totally cut through the buried layer, the buried layer regions, lying between first wall regions, are dielectrically separated from other regions of the buried layer. In conjunction with the feature of the second wall regions, which extend into the buried layer without totally cutting through it, it is possible to contact individual regions of the buried layer individually and electrically. The formation of lateral parasitic components, as they occur in isolations by pn junctions, is prevented by the complete dielectric lateral isolation. By virtue of the fact that in integrated circuits produced according to the invention, the subregions of buried layers, which belong to different active regions, are also dielectrically separated, sensitivity to interferences declines. Because of the contacting of the buried layer, low-doped buried layers without parasitic capacitances may be used. The process module of the invention may be used for both SOI wafers and bulk wafers.

Overall, a lateral dielectric isolation of active semiconductor regions by trench structures with stepped trench cross sections is provided thereby. The inner region cross sections stepped within the trench structure may be utilized with highly conductive material for contacting of the buried layers. Alternatively, the cross sections may be partially filled with isolating material at different depths of the trench structure. Alternatively, semiconductor material such as silicon or the isolating oxide layer of an SOI wafer may lie beneath the buried layer. It is a particular advantage of the invention that it can be carried out with use of a self-aligning two-mask technique, spacer formation for the dielectrically isolating wall regions, and different filling methods such as selective epitaxy or deposition of doped polycrystalline semiconductor material or deposition of metal.

In view of embodiments of the integrated circuit, the trench structures can have second inner regions, which are filled with electrically conductive material and which contact a second layer electrically, which extends along a second side of the buried layer.

By this embodiment, it is also possible that layers lying one over another in several levels can be uniformly electrically controlled.

The second layer can be formed of semiconductor material.

The invention is also usable with so-called bulk wafers by this first alternative embodiment.

As a second alternative, the second layer can be formed of a dielectric material.

The invention is usable for so-called SOI wafers (SOI=semiconductor on insulator).

In view of embodiments of the method, it is preferred that the step of deposition of a dielectric comprises deposition of TEOS oxide.

TEOS is an abbreviation for tetraethylorthosilicate. Silicone dioxide forms from this compound at moderate temperatures (up to about 700° C.) by decomposition. During the deposition of a TEOS oxide, high-value oxide films form, which are notable, for example, for a high breakdown field strength and a conformal edge coverage. The conformal edge coverage is important because of the multilevel structure of the trenches, which are created and used in this invention.

It is also preferred that between the deposition of the dielectric and the filling of the rest of the trench structure, dielectric deposited on bottom areas of the trench structure is removed by an anisotropic etching step.

An etching step is described as anisotropic, if the etch attack proceeds more rapidly in certain spatial directions than in other spatial directions. As a result of etching occurring more rapidly in a perpendicular direction, the previously deposited oxide, which forms the dielectric wall regions, is retained to a very great extent here, whereas the oxide, which is deposited on the bottom areas of the trench structure and which would hamper the desired contacting, is removed.

It is preferred, furthermore, that the first and second opening cross section, a thickness of the deposited dielectric, and the anisotropic etching step are so matched to one another that so much oxide is removed that the later filling with electrically conductive material contacts only the buried layer electrically, but not the second layer.

By means of this embodiment, as an alternative to contacting of at least two layers placed vertically one on another, only one buried layer is also electrically contacted.

Another preferred embodiment is notable in that the first and second opening cross section, a thickness of the deposited dielectric, and the anisotropic etching step are so matched to one another that so much oxide is removed that the later filling with electrically conductive material electrically contacts the buried layer and the second layer.

In this alternative embodiment, several layers placed vertically one on top of another are electrically contacted.

It is also preferable that the rest of the trench structure is filled with metal and/or polycrystalline semiconductor material and/or fine crystalline ("amorphous") semiconductor material.

Alternatively, it is preferred that the rest of the trench structure is filled by means of a selective epitaxy step.

Filling by a selective epitaxy step or by polycrystalline semiconductor material has the additional advantage that a vertical dopant concentration gradient and thereby a vertical conductivity gradient can be established.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
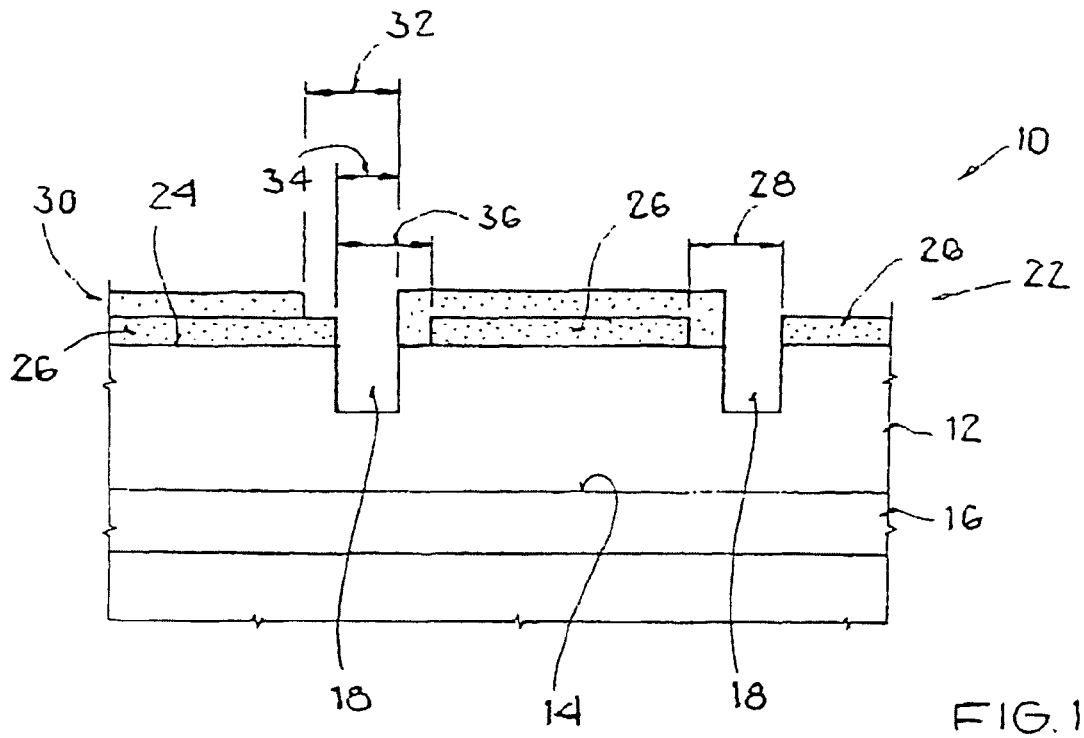
FIG. 1 shows an intermediate product of the manufacturing method of the invention during use on a bulk wafer with the first mask and the second mask after a first etching step.

FIG. 1 shows a wafer 10 with a first layer of active semiconductor material 12, which extends along a first side 14 of a buried layer 16. Because buried layer 16 is embedded on both sides in semiconductor material, for example, in silicon, this type of wafer 10 is also called a bulk wafer. To realize trench substructures 18, a first mask 22, preferably a hard mask including, for example, nitride, is applied and structured on the initially planar wafer 10. For this purpose, after application of an adherent oxide to a side 24, facing away from buried layer 16, of first layer 12, a nitride layer 26 is deposited and structured by lithography and etching steps.

The structuring of nitride layer 26 occurs in such a way that first mask 22 has first openings 28. Then, a second mask 30, for example, a resist mask, is produced self-aligning on first mask 22, whereby second mask 30 has second openings 32, which are laterally displaced compared with the first openings and partially cover first openings 28. As a result, first mask 22 together with second mask 30 defines a first opening cross section 34, and after later removal of second mask 30, the first mask defines a second opening cross section 36, which is larger than first opening cross section 34. The structuring of two masks 22, 30 is followed by an etching step in which first trench substructures 18 are etched through first opening cross section 34 into wafer 10.

Trench substructures 18 may be created, for example, by anisotropic etch attacks. An example of an anisotropic etching process is reactive ion etching. In so doing, ions from a plasma are accelerated by an electric field. When the ions impact the defined trench surface, surface atoms are released out of the lattice of active semiconductor layer 12 in the area of first opening cross section 34, it being possible to superimpose chemical processes on this physical sputter effect. Trench substructures 18 form successively by the continuous impacting of ions from the plasma on first opening cross section 34.

Figure 2:
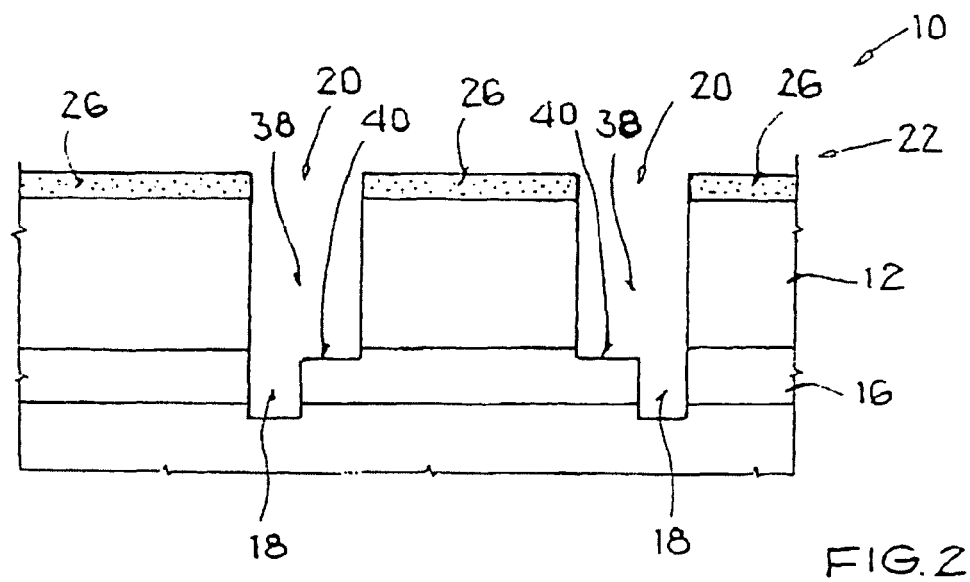
FIG. 2 shows the intermediate product of FIG. 1 after a second etching step and removal of the second mask.

In further steps, for which reference is made to FIG. 2, first removal of second mask 28 and etching of second trench substructures 38 through second opening cross section 36 into buried layer 16 occur. The second trench etching step may be carried out using the same principle as the first trench etching step. A stepped trench structure 20 with trench substructures 18, 38 with an intermediate step 40, which lies in buried layer 16, is formed by means of the multistep etching of the trench structures through different opening cross sections 34, 36.

Figure 3:
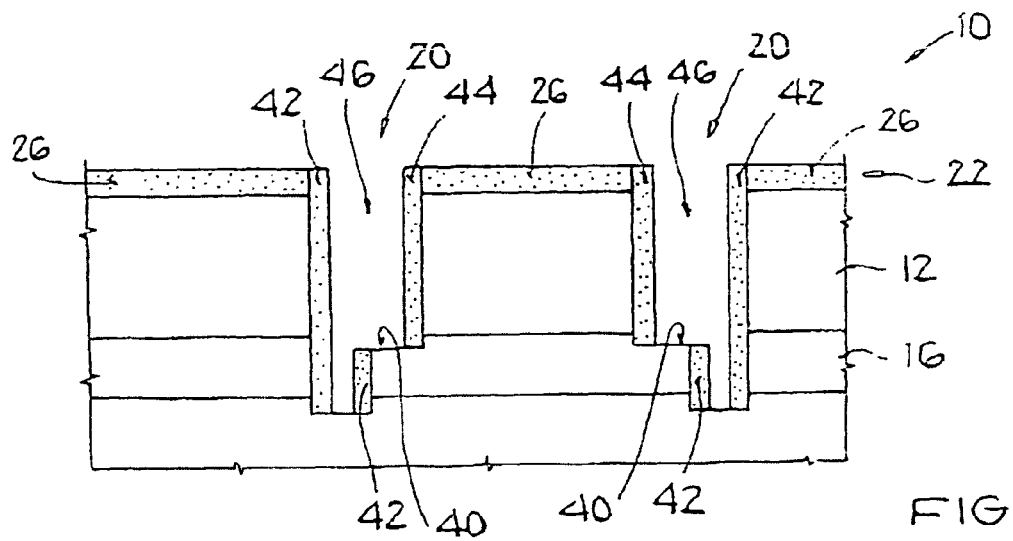
FIG. 3 shows the intermediate product of FIG. 2 after formation of the dielectric wall regions according to a first embodiment.

FIG. 3 shows the results of additional steps. After the etching, a dielectric, for example, a TEOS oxide, is deposited conformly on the inner surfaces of trench structures 20. The deposition of the TEOS oxide preferably precedes a bonding oxidation of the inner wall regions. Desired first wall regions 42 of trench structures 20, which cut completely through buried layer 16, and second wall regions 44, which extend into buried layer 16 without cutting it completely, form as a result of the conformal deposition.

In addition, due to the conformal deposition, oxide layers form on the bottom areas of trench structures 20, particularly on intermediate step 40. The oxide layer, which forms there in buried layer 16, would prevent an electrical contacting of buried layer 16. For this reason, an anisotropic etching step is performed, which preferentially removes material from intermediate step 40 and largely spares wall regions 42, 44. The combination of oxide deposition and the anisotropic etching step is also called spacer technique. Next, inner regions 46 of trench structures 20 are filled with conductive material. The filling can occur, for example, by selective epitaxy. Selective means that during epitaxial growth the process parameters are set such that the growth proceeds only from exposed, single-crystal semiconductor material. No deposition occurs at places where there are other surfaces, for example, oxide or nitride surfaces.

Figure 4:
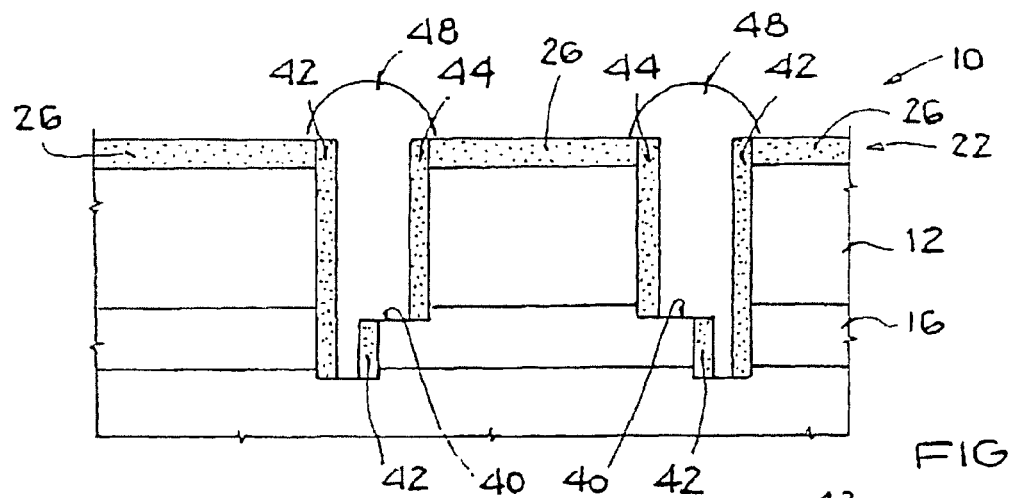
FIG. 4 shows the intermediate product of FIG. 3 after filling of inner regions with highly conductive material by an epitaxy step.

The result of such an epitaxy step is shown in FIG. 4. The filling semiconductor material is deposited first on a seed opening, which has formed due to the anisotropic etching of the oxide. A seed is understood to be a surface structure of a single crystal to which atoms attach during the epitaxy and thereby assume the crystal orientation of the single crystal. It is possible to vary the doping of the growing material during epitaxy. The epitaxial mushrooms 48 forming thereby are then removed by chemical mechanical planarization. The electrical contacting of buried layer 16 occurs via the oxide-free regions of intermediate steps 40.

Figure 5:
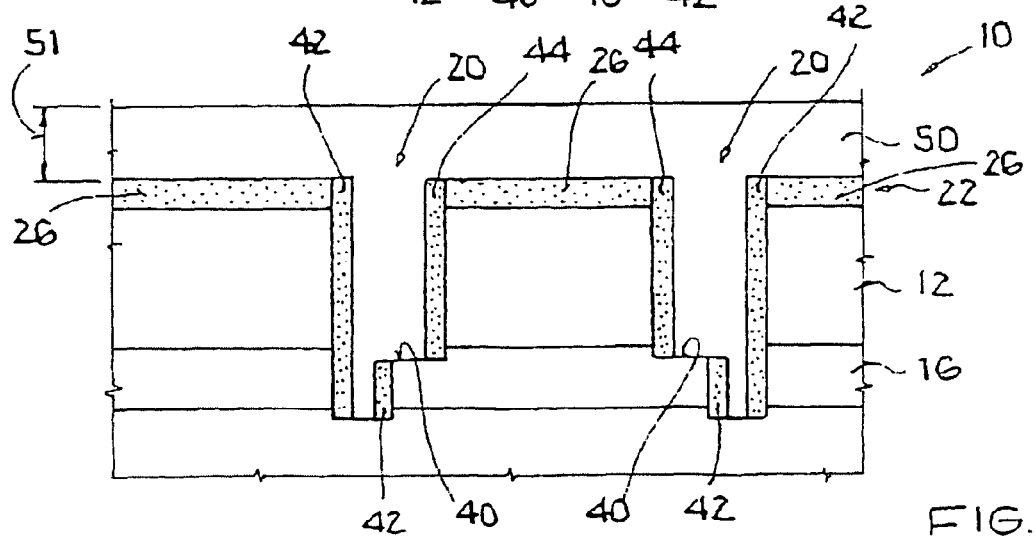
FIG. 5 shows the intermediate product of FIG. 3 after filling of inner regions with highly conductive material by deposition of doped, polycrystalline semiconductor material and/or of metal and/or of amorphous semiconductor material.

Alternatively to a filling of inner regions 46 by an epitaxy step, the filling can also occur by deposition of metal and/or of doped, polycrystalline material and/or of amorphous semiconductor material. This is shown in FIG. 5, in which layer 50 represents a filling with a material of this type. Next, part 51, extending beyond trench structures 20, of layer 50 is removed, for example, by chemical mechanical planarization and first mask 22 is removed by an etching step.

Figure 6:
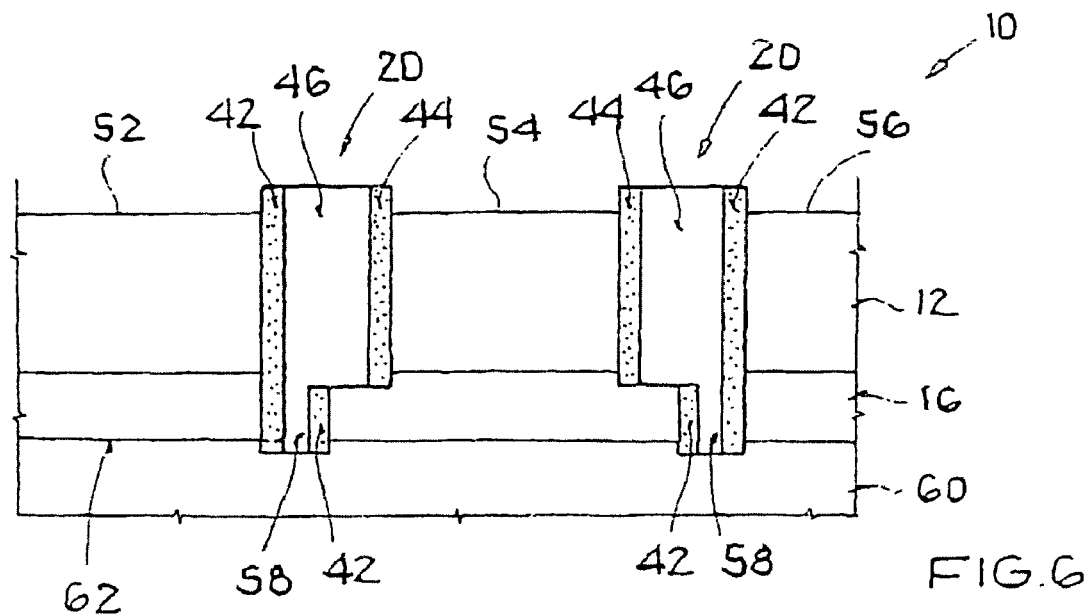
FIG. 6 shows the wafer of FIG. 4 or 5 after removal of excess conductive material and removal of the first mask.

FIG. 6 shows wafer 10 of FIG. 4 or of FIG. 5 after removal of layer 51 and first mask 22. FIG. 6 thereby shows a bulk wafer 10 with trench structures 20, which cut through layer 12 made of active semiconductor material and have dielectric wall regions 42, 44, whereby dielectric wall regions 42, 44 electrically isolate subregions 52, 54, 56 of layer 12, made of active semiconductor material, from one another in the lateral direction, and whereby trench structures 20, furthermore, have first inner 46 regions, which are filled with electrically conductive material and contact buried layer 16 in an electrically conductive manner. In subregions 52, 54, 56 of layer 12, components, for example, field-effect transistors are then formed by additional steps and contacted in order to create an integrated circuit.

In wafer 10 of FIG. 6, the trench structures have second inner regions 58, which are filled with electrically conductive material and contact electrically a second layer 60, which extends along a second side 62 of buried layer 16. Second layer 60 in a bulk wafer 10 includes semiconductor material.

Figure 7:
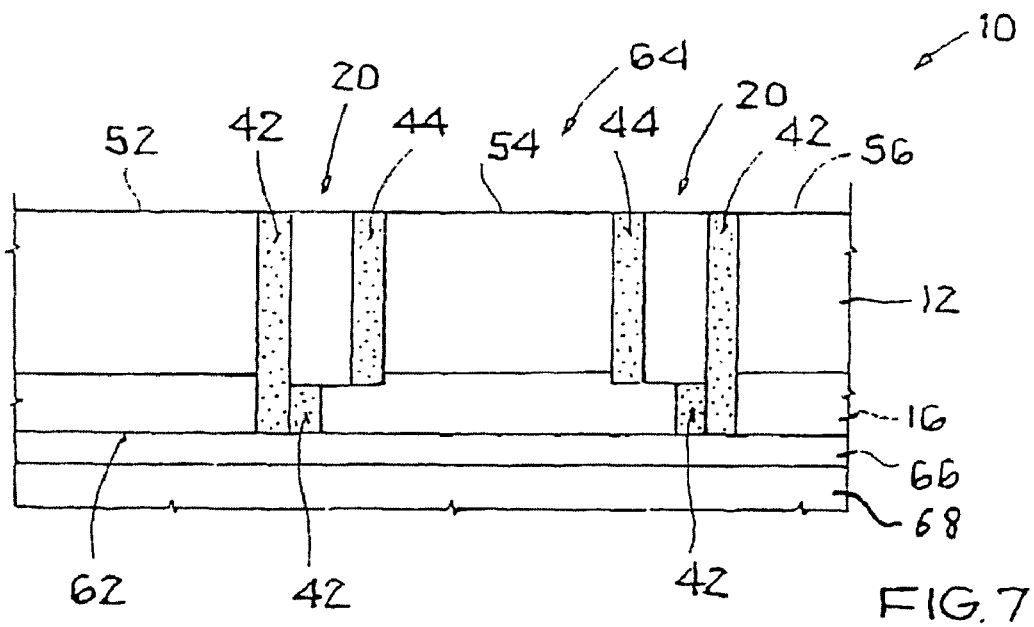
FIG. 7 shows an SOI wafer processed according to and embodiment of the invention.

The invention may also be realized with an SOI wafer 64, in which buried layer 16 extends on a second layer 66 made of dielectric material and underlying semiconductor material 68. This type of SOI wafer 64 is shown in FIG. 7.

Furthermore, first opening cross section 34 and second opening cross section 36, a thickness of the deposited dielectric, therefore a thickness of wall regions 42, 44, and the anisotropic etching step can be so matched to one another that only so much oxide is removed that the later filling with electrically conductive material electrically contacts only buried layer 16, but not second layer 58 or 60. This is also shown in FIG. 7. It is understood, however, that such an embodiment in which only buried layer 16 but not second layer 60, 66, abutting second side 62 of buried layer 16, is contacted may also be realized in wafers 10 according to FIGS. 1 through 6. It is understood, furthermore, that in SOI wafer 64 according to FIG. 7 semiconductor layer 68 as well, lying beneath oxide layer 66, may be electrically contacted.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated circuit comprising:
   a first layer made of active semiconductor material and extending along a first side of a buried layer; and
   a plurality of trench structures that cut through the first layer made of active semiconductor material and each of said plurality of trench structures have a first dielectric wall region and a second dielectric wall region, the first and second dielectric wall regions electrically isolating subregions of the first layer from one another in a lateral direction, each of the plurality of trench structures further including first inner regions, which are filled with electrically conductive material and contact the buried layer in an electrically conductive manner,
   wherein said first dielectric wall region of each of the plurality of trench structures completely cuts through the buried layer and said second dielectric wall region of each of the plurality of trench structures extends into the buried layer without cutting it completely.

2. The integrated circuit according to claim 1, wherein the trench structures have second inner regions, which are filled with electrically conductive material and which contact electrically a second layer, which extends along a second side of the buried layer.

3. The integrated circuit according to claim 2, wherein the second layer is formed of a semiconductor material.

\* \* \* \* \*